US008760923B2

(12) United States Patent
Mu et al.

(10) Patent No.: US 8,760,923 B2
(45) Date of Patent: Jun. 24, 2014

(54) NON-VOLATILE MEMORY (NVM) THAT USES SOFT PROGRAMMING

(75) Inventors: Fuchen Mu, Austin, TX (US); Yanzhuo Wang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/596,764

(22) Filed: Aug. 28, 2012

(65) Prior Publication Data

US 2014/0063946 A1 Mar. 6, 2014

(51) Int. Cl.
*G11C 11/34* (2006.01)
(52) U.S. Cl.
USPC .................................................. 365/185.11
(58) Field of Classification Search
USPC .................................................. 365/185.11
See application file for complete search history.

(56) References Cited

U.S. PATENT DOCUMENTS

| 6,493,266 | B1 * | 12/2002 | Yachareni et al. | 365/185.22 |
| 7,649,782 | B2 * | 1/2010 | Eguchi et al. | 365/185.22 |
| 7,864,588 | B2 | 1/2011 | Betser et al. | |
| 2003/0021155 | A1 * | 1/2003 | Yachareni et al. | 365/185.22 |
| 2009/0135659 | A1 * | 5/2009 | Jones et al. | 365/185.29 |
| 2009/0228739 | A1 * | 9/2009 | Cohen et al. | 714/6 |
| 2010/0027350 | A1 * | 2/2010 | Melik-Martirosian et al. | 365/185.22 |
| 2010/0265775 | A1 * | 10/2010 | Chang et al. | 365/185.33 |
| 2012/0026792 | A1 * | 2/2012 | Moschiano et al. | 365/185.03 |
| 2012/0268999 | A1 * | 10/2012 | Tan | 365/185.19 |

* cited by examiner

*Primary Examiner* — Hoai V Ho
*Assistant Examiner* — Pablo Huerta
(74) *Attorney, Agent, or Firm* — Egan, Peterman, Enders LLP.

(57) ABSTRACT

A semiconductor memory device comprises a memory controller, and an array of memory cells coupled to communicate with the memory controller. The memory controller is configured to perform a first soft program operation using first soft program voltages and a first soft program verify level, and determine whether a first charge trapping threshold has been reached. When the first charge trapping threshold has been reached, a second soft program operation is performed using second soft program voltages and a second soft program verify level.

21 Claims, 3 Drawing Sheets

NON-VOLATILE MEMORY (NVM) THAT USES SOFT PROGRAMMING

BACKGROUND

1. Field

This disclosure relates generally to non-volatile memories (NVMs), and more specifically, to NVMs that include soft programming.

2. Related Art

Non-volatile memories (NVMs) generally require special operations for program and erase and there is a limit to how many times these operations can be performed. During an erase memory cells that have been erased successfully may continue to be subjected to erase conditions while other memory cells are still being erased. These bits that are slow to erase may be referenced as slow bits. Some memory cells may be over-erased that then must be subjected to compaction and then soft programmed to overcome the problems associated with over-erase such as excessive leakage as part of the embedded erase operation. Soft programming typically takes a relatively long time since it is done per address and with low bias. With more cells required to be soft programmed, it may eventually cause the embedded erase operation to fail to complete within the specified maximum time. Soft program time is the major part of the embedded erase time. For large blocks (>64 kB), soft program time dominates the embedded erase time. Another issue over time and perhaps tens of thousands of cycles or more is that memory cells become weak or slow to erase and so does the soft program. The long erase time can become a significant and may be only relevant to a few bits which are slow to erase, thus cause the main population to be over erased. Thus it requires even longer soft program time to finish embedded erase.

Accordingly, there is a need for an NVM system to improve upon one or more of the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, altering a soft programming process based on a determination that a charge trapping threshold had been met. The alteration includes both changing the soft programming voltages and lowering the verification level. This is better understood by reference to the drawings and the following written description.

Figure 1:
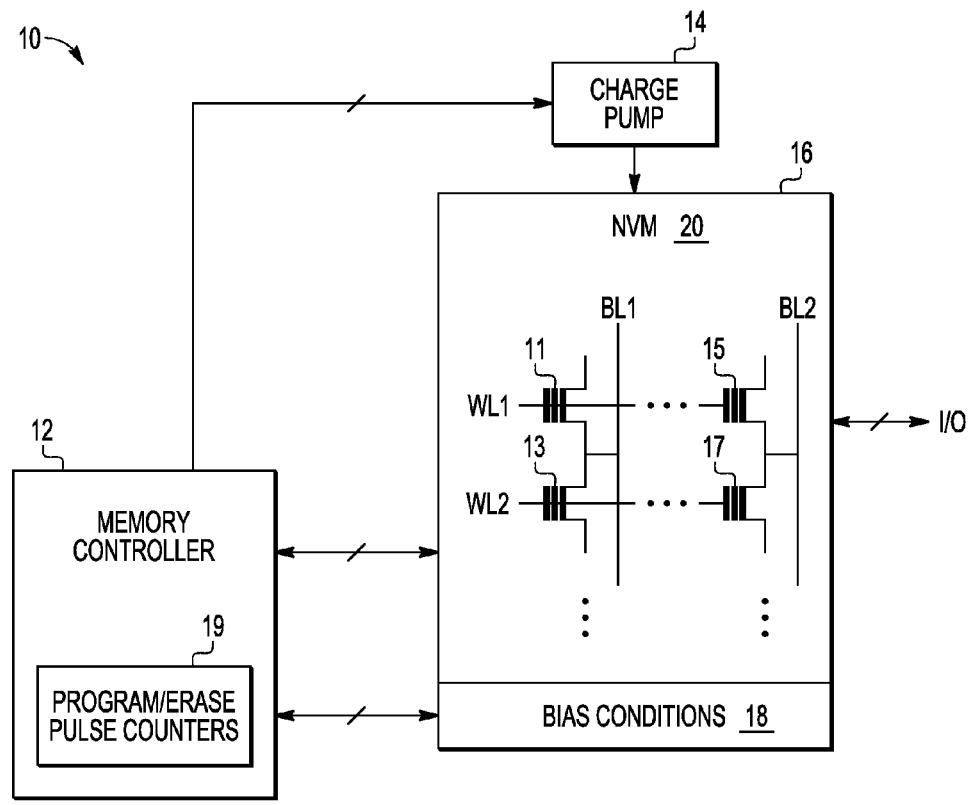
FIG. 1 is an NVM system according to an embodiment.

Shown in FIG. 1 is a non-volatile memory (NVM) system 10 having a memory controller 12, a charge pump 14, and an NVM memory 16 having a major portion referenced as NVM array 20 and a lesser portion referenced as bias conditions 18. These two portions may be different blocks. Memory controller 12 includes a program/erase pulse counter that counts the number of cumulative program/erase cycles, the number of pulses for each erase operation, and the number of pulses for each program operation. Shown in NVM array are NVM cells 11, 13, 15, and 17 connected to word lines WL1 and WL2 and bit lines BL1 and BL2 in typical fashion. Shown are floating gate NVM cells but they could instead use nanocrystals or nitride for charge storage. NVM array 20 may be a single array or be divided further into blocks. Blocks allow for erasing by block instead of the whole array. For example, the bias conditions portion 18 may be erased separately from NVM array 20. NVM cells may be referenced as bits.

Figures 2, 3:
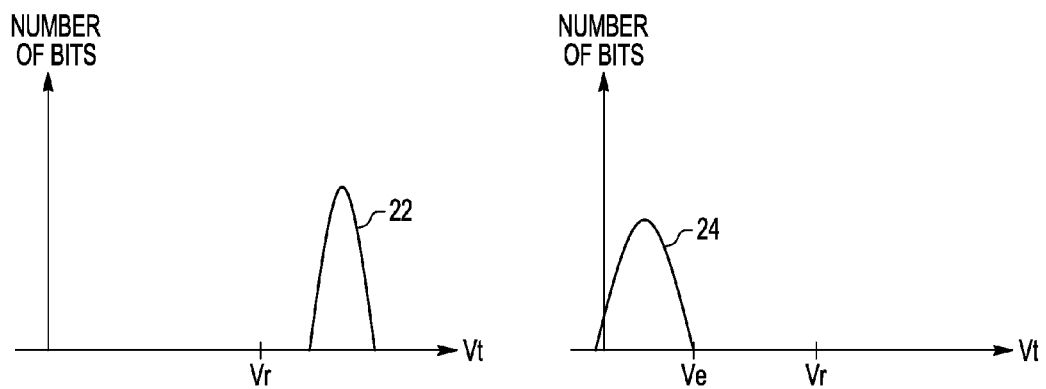
FIG. 2 is a diagram helpful in understanding the NVM system of FIG. 1.
FIG. 3 is a diagram helpful in understanding the NVM system of FIG. 1.
Figure 4:
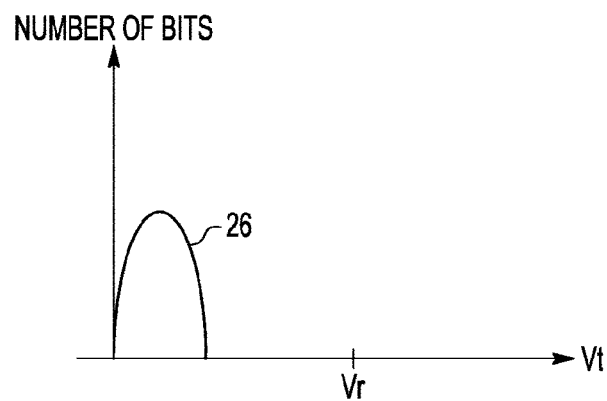
FIG. 4 is a diagram helpful in understanding the NVM system of FIG. 1.
Figure 5:
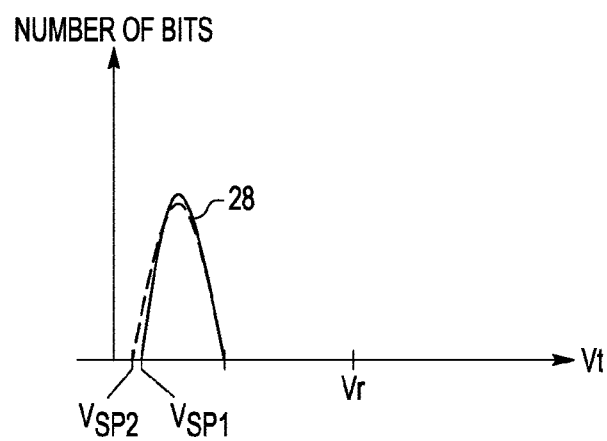
FIG. 5 is a diagram helpful in understanding the NVM system of FIG. 1.

Memory controller 12 controls the operation of NVM array 20 such as controlling erase cycles, reading, and programming. The programmed NVM cells are in distribution 22 as shown in FIG. 2. In this case, an erase cycle begins with an erase operation in which an erase pulse is applied to NVM array 20 or a subarray thereof. Additional pulses may be applied to ensure that all of the bits have a threshold voltage below a reference threshold voltage Ve resulting in a distribution 24 shown in FIG. 3. After sufficient pulses, a compaction occurs which is to ensure that none of the NVM cells have a negative threshold voltage as shown as distribution 26 as shown in FIG. 4. After compaction, soft programming occurs at those addresses at which there is at least one NVM cell whose threshold voltage is not sufficiently above zero. Soft programming is one of the most time consuming processes for the erase operation. When there have been relatively few program/erase cycles, the NVM cells easily reach the minimum threshold voltage for sufficient soft programming. This is determined by a soft programming verify level, which is a voltage level that corresponds to the desired threshold voltage that all of the NVM cells preferably exceed. The result of this is distribution 28 as shown as the continuous dark line in FIG. 5. The lowest threshold voltage of distribution 28 in the continuous line is achieved with a verify level of soft program verify level of Vsp1. On the other hand, after a large number of program/erase cycles, the programming becomes difficult and can require a significantly increased number of erase pulses. When this occurs, the soft program conditions are changed to increase the propensity for charge to be added to the charge storage portion of the NVM cells being subjected to soft programming. Also the verify level is reduced so that the slow bits can more easily pass. The slow bits must still have a threshold voltage in excess of zero by some margin. The result is distribution 28 using the dotted line to replace a portion of the continuous line. The lower threshold voltage of this distribution 28 using the dotted line is achieved using verify voltage Vsp2. Programming is preferably achieved using hot carrier injection. The parameter adjustment for the hot carrier injection using soft programming verify voltage Vsp2 is to increase the gate voltage and the drain voltage for the NVM cells which need to be soft programmed. Shown in FIG. 5, by lowering the soft program verify level and increasing the soft program gate voltage and the soft program drain voltage, after soft program finishes, the memory cell distribution 28 keeps the same shape as without these changes. This can be stated as, there are no excessive memory cells at lower threshold voltage level due to the lowered soft program verify level. It's leveraged by the elevated soft program gate voltage and elevated soft program drain voltage.

Figure 6:
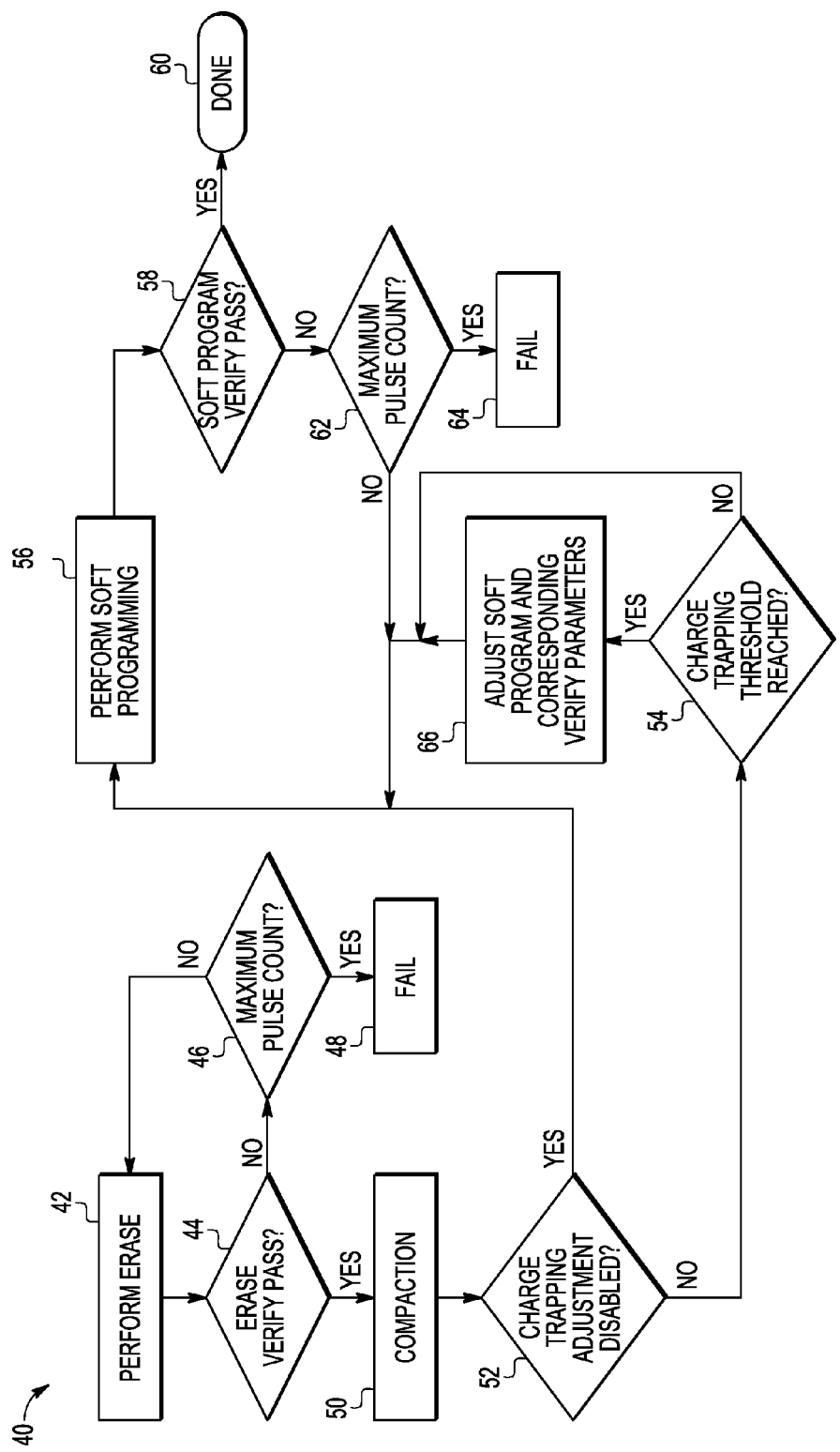
FIG. 6 is a flow chart helpful in understanding the NVM system of FIG. 1.

A flow chart 40 is shown in FIG. 6 for achieving the programming depicted in FIGS. 2-5 in memory controller 12 controls an erase operation on NVM array 20 using charge pump 14 and bias conditions 18. An erase step is performed in step 42 in which an erase pulse is applied to NVM array 20 or a block of NVM array 20. As shown in step 44, a verification of the erase is performed. If one or more of the memory cells do not have a threshold voltage sufficiently below erase verify voltage Ve as shown in FIG. 3, then there is a determination at step 46 as to how may erase pulses have been applied. If the maximum pulse count has not been reached, then the erase process continues with the application of another erase pulse at step 42. If the maximum has been reached, then the erase process has failed as shown in step 48. Thus, erase pulses continued to be applied until either it is verified that all of the memory cells have been sufficiently erased or the maximum pulse count has been reached.

Once all of the memory cells have been sufficiently erased, a compaction at step 50 occurs which is a weak programming step to raise the threshold voltage of those cells to at least zero for those with a negative threshold voltage. It is not critical if some cells are slightly below zero threshold voltage so a verify step may not be needed. Compaction has the effect of tightening the distribution as shown as distribution 24. Soft programming occurs after compaction and the parameters for soft programming are adjustable. The adjustment for soft programming may be disabled and that is checked at step 52. If the adjustment has not been disabled, then the next step, step 54, is to determine if a charge trapping threshold has been reached.

Charge trapping, after many cycles, reduces the efficiency of programming and erasing. The degree of charge trapping is measured indirectly. One measure is the number of program operations that are required to achieve programming of all the NVM cells. A program pulse is applied for each program operation. As charge trapping occurs, the number of pulses to achieve the programmed state increases. Thus, one way to determine that the charge trapping threshold has been reached is when, during normal programming as distinct from soft programming, the maximum program pulse count has reached a predetermined number. The number would be based on experimentation. For example, the maximum number of programming pulses when there is minimal charge trapping may be 2 and the number when there is significant charge trapping may be 5. Thus, 5 may be the threshold chosen for the maximum number of programming pulses to determine that there should be a parameter change for the soft program operations. Another measure is the number of program/erase cycles. This can simply be a cumulative count of the number of times that NVM array 20 or blocks within NVM array 20 have been programmed and erased. In the case of multiple blocks, there could be a separate count for each block. An exemplary number for inferring that the charge trapping threshold has been reached is 100,000 program/erase cycles. Another measure is the number of erase operations, step 42, to achieve erase. As for programming there is a pulse applied for each erase operation. Thus a count of the number of erase pulses for a given erase cycle can be used to determine that the charge trapping threshold has been reached. Memory controller 12 uses program/erase counters 19 for these purposes. For example, the number of erase pulses when there is minimal charge trapping may be 25 and the number when there is significant charge trapping may be 50. Thus, 50 may be the threshold chosen for the number of erase pulses to determine that there should be a parameter change for the soft program operations. To be safe, one way to determine that the charge trapping threshold has been met is that if any one or more of the individual thresholds for program/erase cycles, erase pulses, and program pulses are met, then the charge trapping threshold voltage is met and the soft programming parameters are changed. Other possibilities include requiring all three or two out of three, counting only one or two of the three, or having a different measure of charge trapping than those described.

Thus, if after determining in step 54 that the charge trapping threshold has not been met, then a soft programming operation is performed at step 56 using nominal parameters and applying a soft programming pulse in which positive voltages may be applied to gates and drains and ground may be applied at the sources. After performing the soft programming operation, a verification step 58 determines if the memory cells are sufficiently above zero threshold voltage. This determination is made using a first selected verify voltage Vsp1. This may also be called the nominal verify voltage which is the one used prior to changing the soft programming parameters due to charge trapping. If the determination is that all of the cells have a sufficiently high threshold voltage, Vsp1 shown in FIG. 5, which would be indicated by passing using the first selected verify voltage, then the soft programming is complete which also completes an erase cycle as indicated in step 60. If verify step 58 indicates that not all of the memory cells pass, then there is a determination at step 62 as to whether the maximum number of soft programming pulses has been applied. If so, this would be a failed soft programming cycle and thus a failed erase cycle. If the maximum number of soft programming pulses has not been reached, then soft programming continues with step 56. Soft programming, verification, and checking for the maximum soft programming pulse count continues until either soft programming is successful and soft programming is done or the maximum soft programming pulse count has been reached and soft programming has failed.

If at step 54 it is determined that the charge trapping threshold has been reached, then the next step is step 66 in which the parameters for the soft programming of step 56 and verification of step 58 are adjusted. Information, as to what the adjusted parameters are, is stored in bias conditions portion 18 of memory 16 and is accessed by memory controller 12. For the soft programming of step 56 the gate and drain voltage applied by the soft programming pulse are increased. Memory controller 12 controls charge pump 14 as necessary to obtain the desired programming voltages. For the verification of step 58, there is second selected verify voltage that corresponds to threshold voltage Vsp2 shown in FIG. 5. Memory controller can generate the needed reference voltages to perform verifications at the first selected verify voltage and the second selected verify voltage. After making the parameter adjustments, soft programming is performed using the adjusted parameters. Using the adjusted soft programming pulse has the effect of increasing the propensity for charge to reach a charge storage layer. Verification 58 then determines if the lower threshold voltage of voltage Vsp2 has been reached. If so, then the process is done at step 60. If not, then there is the determination of the soft programming pulse count. If even with the adjusted parameters the maximum soft programming pulse count is met, then the soft programming cycle has failed at step 64. If the maximum programming pulse count has not been met, then soft programming operations and verifications continue with the adjusted soft programming pulse and the second selected verify voltage until either there is a pass determination at verify 58 and the soft program operation is done or the maximum count is reached and the soft programming has failed.

If at step 52, it is determined that the parameter change due to the charge trapping threshold being reached is to be disabled, then the next step is to perform soft programming at step 56 using the nominal parameters. The method continues with verification and maximum soft programming pulse count determination as described previously. Thus, even if the charge trapping threshold has been reached, the soft programming can continue using the nominal parameters instead of the adjusted ones.

Experience indicates that only a few bits do not make the Vsp1 threshold voltage so although they have increased leakage due to the lower threshold voltage of Vsp2, the contribution to the total leakage is small. Thus, with nearly all of the bits having at least threshold voltage Vsp1, the total leakage is sufficiently small even with a few bits at the lower threshold voltage Vsp2. Thus, with the combination of increased soft programming voltages and reduced verify level, the bits can be efficiently soft programmed to at least threshold voltage Vsp2. Also because the bits that receive the enhanced soft programming pulse have already been shown to program slowly, they don't become overprogrammed and thus avoid disturbing distribution 28 with the enhanced soft program pulse.

By now it should be appreciated that there has been provided a semiconductor memory device including a memory controller and an array of memory cells coupled to communicate with the memory controller. The memory controller is configured to perform a first soft program operation using first soft program voltages and a first soft program verify level, determine whether a first charge trapping threshold has been reached, and when the first charge trapping threshold has been reached, perform a second soft program operation using second soft program voltages and a second soft program verify level. The semiconductor memory device may have a further characterization by which the first soft program voltages are less than the second soft program voltages. The semiconductor memory device may have a further characterization by which the first soft program verify level is greater than the second soft program verify level. The semiconductor memory device may have a further characterization by which the first charge trapping threshold is reached when at least one of a group consisting of a maximum program pulse count, a maximum soft program pulse count, an erase pulse count, and program/erase cycle count, exceeds a predetermined threshold. The semiconductor memory device may further include a storage area that includes the first and second soft program voltages, the first and second soft program verify levels, and the first charge trapping threshold. The semiconductor memory device may have a further characterization by which determine whether a second charge trapping threshold has been reached and when the second charge trapping threshold has been reached, perform a third soft program operation using third soft program voltages and a third soft program verify level. The semiconductor memory device may have a further characterization by which the second soft program voltages are less than the third soft program voltages, and the second soft program verify level is greater than the third soft program verify level. The semiconductor memory device may have a further characterization by which one of the first soft program voltages is applied to a gate of each of the memory cells and another one of the first soft program voltages is applied to a drain of the each of the memory cells.

Also disclosed is a method that includes performing a successful erase operation on a set of non-volatile memory cells and determining whether a charge trapping threshold has been reached. If the charge trapping threshold has been reached, adjusting a soft program voltage, adjusting a soft program verify level, and performing a soft program operation on the memory cells using the adjusted soft program voltage and the adjusted soft program verify level. The method may have a further characterization by which the soft program voltage and the adjusted soft program voltage are applied to a gate of each of the memory cells. The method may have a further characterization by which the soft program voltage and the adjusted soft program voltage are applied to a drain of each of the memory cells. The method may have a further characterization by which the soft program voltage is less than the adjusted soft program voltage. The method may have a further characterization by which the soft program verify level is greater than the adjusted soft program verify level. The method may have a further characterization by which the soft program voltage and the adjusted soft program voltage are applied to a drain of each of the memory cells, and a second soft program voltage and a second adjusted soft program voltage are applied to a gate of each of the memory cells. The method may have a further characterization by which the charge trapping threshold is reached when at least one of the group consisting of: a maximum program pulse count, a maximum soft program pulse count, an erase pulse count, and program/erase cycle count, exceeds a predetermined threshold.

Also disclosed is a method that includes, during an erase cycle performed on an array of memory cells, wherein the array includes a plurality of blocks of the memory cells verifying that an erase operation has been successfully performed on a block of the memory cells and determining whether charge trapping adjustment is enabled. If the charge trapping adjustment is enabled, determining whether a charge trapping threshold has been reached. If the charge trapping threshold has been reached, adjusting at least one soft program voltage and a soft program verify level and using the adjusted soft program voltage and the adjusted soft program verify level to perform a soft program operation on the block of the memory cells. The method may have a further characterization by which wherein the at least one soft program voltage is applied to one of a group consisting of: a drain of the memory cells and a gate of the memory cells. The method may have a further characterization by which, if the charge trapping threshold has been reached, adjusting a second soft program voltage, applying the at least one soft program voltage to a drain of the memory cells, and applying the second soft program voltage to a gate of the memory cells. The method may have a further characterization by which the one soft program voltage is less than the adjusted soft program voltage and the soft program verify level is greater than the adjusted soft program verify level. The method may have a further characterization by which the charge trapping threshold is reached when at least one of a group consisting of: a maximum program pulse count, a maximum soft program pulse count, an erase pulse count, and program/erase cycle count, exceeds a predetermined threshold.

Although the invention is described herein with reference to specific embodiments, various modifications and changes can be made without departing from the scope of the present invention as set forth in the claims below. For example, the method can be varied to have additional features, fewer features, or a different order than that described. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor memory device comprising:
a memory controller;
an array of memory cells coupled to communicate with the memory controller;
wherein the memory controller is configured to
perform a first soft program operation using first soft program voltages and a first soft program verify level;
determine whether a first charge trapping threshold has been reached; and
when the first charge trapping threshold has been reached, perform a second soft program operation using second soft program voltages and a second soft program verify level;
wherein the first soft program verify level is greater than the second soft program verify level; and
wherein the first charge trapping threshold is reached when at least one of a group consisting of: a program pulse count, a soft program pulse count, and an erase pulse count, exceeds a predetermined threshold.

2. The semiconductor memory device of claim 1 wherein the first soft program voltages are less than the second soft program voltages.

3. The semiconductor memory device of claim 2 wherein one of the first soft program voltages is applied to a gate of each of the memory cells and another one of the first soft program voltages is applied to a drain of the each of the memory cells.

4. The semiconductor memory device of claim 1 further comprising:
a storage area that includes the first and second soft program voltages, the first and second soft program verify levels, and the first charge trapping threshold.

5. The semiconductor memory device of claim 1, wherein the memory controller is further configured to:
determine whether a second charge trapping threshold has been reached; and
when the second charge trapping threshold has been reached, perform a third soft program operation using third soft program voltages and a third soft program verify level.

6. The semiconductor memory device of claim 5 wherein the second soft program voltages are less than the third soft program voltages, and the second soft program verify level is greater than the third soft program verify level.

7. The semiconductor memory device of claim 1 wherein the first charge trapping threshold is reached when at least two of a group consisting of: a program pulse count, a soft program pulse count, and an erase pulse count, exceeds a predetermined threshold.

8. The semiconductor memory device of claim 1 wherein the first charge trapping threshold is reached when each of a group consisting of: a program pulse count, a soft program pulse count, and an erase pulse count, exceeds a predetermined threshold.

9. A method comprising:
performing a successful erase operation on a set of non-volatile memory cells;
determining whether a charge trapping threshold has been reached; and
if the charge trapping threshold has been reached, adjusting a soft program voltage, adjusting a soft program verify level, and performing a soft program operation on the memory cells using the adjusted soft program voltage and the adjusted soft program verify level;
wherein the soft program verify level is greater than the adjusted soft program verify level; and
wherein the charge trapping threshold is reached when at least one of the group consisting of: a program pulse count, a soft program pulse count, and an erase pulse count, exceeds a predetermined threshold.

10. The method of claim 9 wherein the soft program voltage and the adjusted soft program voltage are applied to a gate of each of the memory cells.

11. The method of claim 9 wherein the soft program voltage and the adjusted soft program voltage are applied to a drain of each of the memory cells.

12. The method of claim 9 wherein the soft program voltage is less than the adjusted soft program voltage.

13. The method of claim 9 wherein the soft program voltage and the adjusted soft program voltage are applied to a drain of each of the memory cells, and a second soft program voltage and a second adjusted soft program voltage are applied to a gate of each of the memory cells.

14. The method of claim 9 wherein the first charge trapping threshold is reached when at least two of a group consisting of: a program pulse count, a soft program pulse count, and an erase pulse count, exceeds a predetermined threshold.

15. The method of claim 9 wherein the first charge trapping threshold is reached when each of a group consisting of: a program pulse count, a soft program pulse count, and an erase pulse count, exceeds a predetermined threshold.

16. A method, the method comprising:
during an erase cycle performed on an array of memory cells, wherein the array includes a plurality of blocks of the memory cells:
verifying that an erase operation has been successfully performed on a block of the memory cells;
determining whether charge trapping adjustment is enabled;
if the charge trapping adjustment is enabled, determining whether a charge trapping threshold has been reached: and
if the charge trapping threshold has been reached, adjusting at least one soft program voltage and a soft program verify level and using the adjusted soft program voltage and the adjusted soft program verify level to perform a soft program operation on the block of the memory cells;
wherein the soft program verify level is greater than the adjusted soft program verify level; and
wherein the charge trapping threshold is reached when at least one of the group consisting of: a program pulse count, a soft program pulse count, and an erase pulse count, exceeds a predetermined threshold.

17. The method of claim 16 wherein the at least one soft program voltage is applied to one of a group consisting of: a drain of the memory cells and a gate of the memory cells.

18. The method of claim 16 further comprising:
if the charge trapping threshold has been reached, adjusting a second soft program voltage, applying the at least one soft program voltage to a drain of the memory cells, and applying the second soft program voltage to a gate of the memory cells.

19. The method of claim 16 wherein the one soft program voltage is less than the adjusted soft program voltage.

20. The method of claim 16 wherein the first charge trapping threshold is reached when at least two of a group consisting of: a program pulse count, a soft program pulse count, and an erase pulse count, exceeds a predetermined threshold.

21. The method of claim 16 wherein the first charge trapping threshold is reached when each of a group consisting of: a program pulse count, a soft program pulse count, and an erase pulse count, exceeds a predetermined threshold.

* * * * *